Figure 1A:
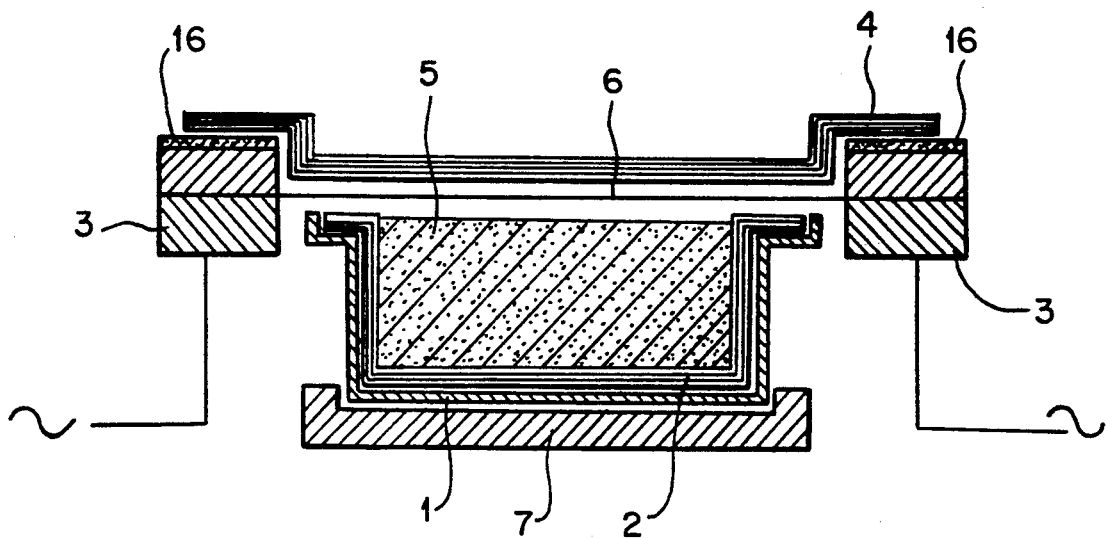

United States Patent [19]

Weinert

[11] Patent Number: 5,239,611
[45] Date of Patent: Aug. 24, 1993

[54] SERIES EVAPORATOR

[76] Inventor: Hilmar Weinert, Schulstr. 1, D-8950 Kaufbeuren 2, Fed. Rep. of Germany

[21] Appl. No.: 830,685

[22] Filed: Feb. 4, 1992

[30] Foreign Application Priority Data

Feb. 14, 1991 [DE] Fed. Rep. of Germany ....... 4104415

[51] Int. Cl.⁵ ............................................. C23C 14/26
[52] U.S. Cl. ..................... 392/388; 118/726
[58] Field of Search ............ 392/388, 389, 391; 118/726, 727

[56] References Cited

U.S. PATENT DOCUMENTS

| 2,447,789 | 8/1948 | Barr | 392/389 |
| 2,998,376 | 8/1961 | Smith | 118/726 |
| 3,260,235 | 7/1966 | Witz | 392/388 |
| 3,647,197 | 3/1972 | Halloway | 118/726 |
| 4,094,269 | 6/1978 | Malinovski | 392/388 |
| 4,401,052 | 8/1983 | Baron | 118/726 |
| 4,748,313 | 5/1988 | de Rudnay | 392/391 |

FOREIGN PATENT DOCUMENTS

| 970246 | 7/1949 | Fed. Rep. of Germany . |
| 976068 | 7/1949 | Fed. Rep. of Germany . |
| 59-43871 | 3/1984 | Japan ............... 118/726 |
| 225422 | 6/1948 | Switzerland . |

OTHER PUBLICATIONS

Da Silva, E. M., Evaporation Method & Apparatus, I.B.M. Tech. Disc. Bull., vol. 4, No. 4, Sep. 1961.

Primary Examiner—Teresa J. Walberg
Attorney, Agent, or Firm—Collard & Roe

[57] ABSTRACT

A device for heating a material to an evaporation temperature so that the material can be coated on a substrate is provided which includes a series evaporator for containing the material to be coated. There is also provided a plurality of radiant heaters disposed above the evaporator and the material to be evaporated, the heaters each being essentially flat and disposed parallel and adjacent to the upper surface of the material. Heat shields are also disposed above the radiant heaters and below a substrate to be coated and have an area sufficient to prevent direct radiant heat contact with the substrate to be coated. A plurality of vapor outlet openings are formed between each adjacent heat shield of the series evaporator and face the substrate to be coated. The outlets are in vapor communication with the material being evaporated. Each of the radiant heaters are located beneath an upper heat shield and within the area protected by the heat shields.

14 Claims, 4 Drawing Sheets

SERIES EVAPORATOR

The invention relates to a series evaporator with thermal insulation on all sides, radiant heaters and heat shields that have a number of vapour outlet openings facing a substrate that is to be coated.

CH-PS 255 422 discloses a single evaporator die which extends at right angles to the direction of movement of the web being coated and which has inserts dividing it up into sections.

With this evaporator it is only possible to use liquid material that has been heated to evaporation temperature by a tubular heating element. This heating element is located exactly below the outlet die.

Apart from this, DE-PS 976 068 describes a process and an apparatus for the evaporative coating of a moving substrate, with a die provided as the outlet for a precisely directed jet of vapour.

In addition, DE-PS 970 246 discloses an apparatus for the continuous evaporative coating of endless material that is provided with several slit-like openings as outlets for the vapour-like coating substrate.

On the basis of this prior art, the purposes of the invention are to shield the substrate that is to be coated to a large extent against heat radiated by the evaporator and to coat the substrate uniformly and efficiently while avoiding damage to the substrate.

In the solution to this problem proposed by the invention, the radiant heaters are essentially flat, are each located underneath an upper heat shield and within the area protected by the shield concerned, and run parallel to the surface of the material that is to be evaporated, while the outlet openings directed towards the material that is to be coated are provided between the radiant heaters.

In this way the whole of the surface of the material that is to be evaporated is heated up uniformly, so that evaporation is carried out very effectively. This configuration also makes sure that particles escaping from the material due to the radiant heating do not reach and damage the substrate that is to be coated through the outlet openings.

It is very advantageous if in accordance with the invention the material that is to be evaporated is a substance that evaporates by sublimation in a high vacuum, such as silicon monoxide, magnesium oxide, mixtures of metals and their oxides, chromium metal.

In a further advantageous development of the invention, vessels made from metal with a high melting point, boron nitride, titanium boride or sintered mixtures of them, aluminium oxide, magnesium oxide or beryllium oxide are provided to hold liquid metals, so that these metals can be evaporated from their liquid phase.

It is also very advantageous if in accordance with the invention a partition wall is fitted in the section of the evaporator holding the material that is to be evaporated, thus creating two compartments for the simultaneous evaporation of two sublimating materials with similar vapour pressure levels, these two materials not mixing until they are both in the vapour phase.

In this way a very efficient process is created for carrying out coating with several materials.

It is also very advantageous if in accordance with the invention vessels with two channels or pairs of individual vessels are provided to hold two liquid materials with similar vapour pressure levels for simultaneous evaporation, while these materials only mix in the vapour phase.

It has also proved to be very advantageous if in accordance with the invention the radiant heaters are made from tungsten, tantalum or molybdenum.

It is also very favourable if in accordance with the invention the radiant heaters are in the form of plates, wire netting or parallel bars or wires distributed to cover the required area.

In an advantageous development of the invention the thermal insulation of both the evaporator housing and the upper shield plates consists of several individual plates made from molybdenum, tungsten or tantalum, each of which is less than one millimeter thick.

In accordance with the invention, the thermal insulation of the evaporator housing and the upper shield plates can, however, also be made from graphite, aluminium oxide, zirconium oxide, sintered boron nitride/titanium boride mixtures, with a thickness of 1 to 4 mm per layer.

Two embodiments of the invention are illustrated in the drawings.

Figure 1B:
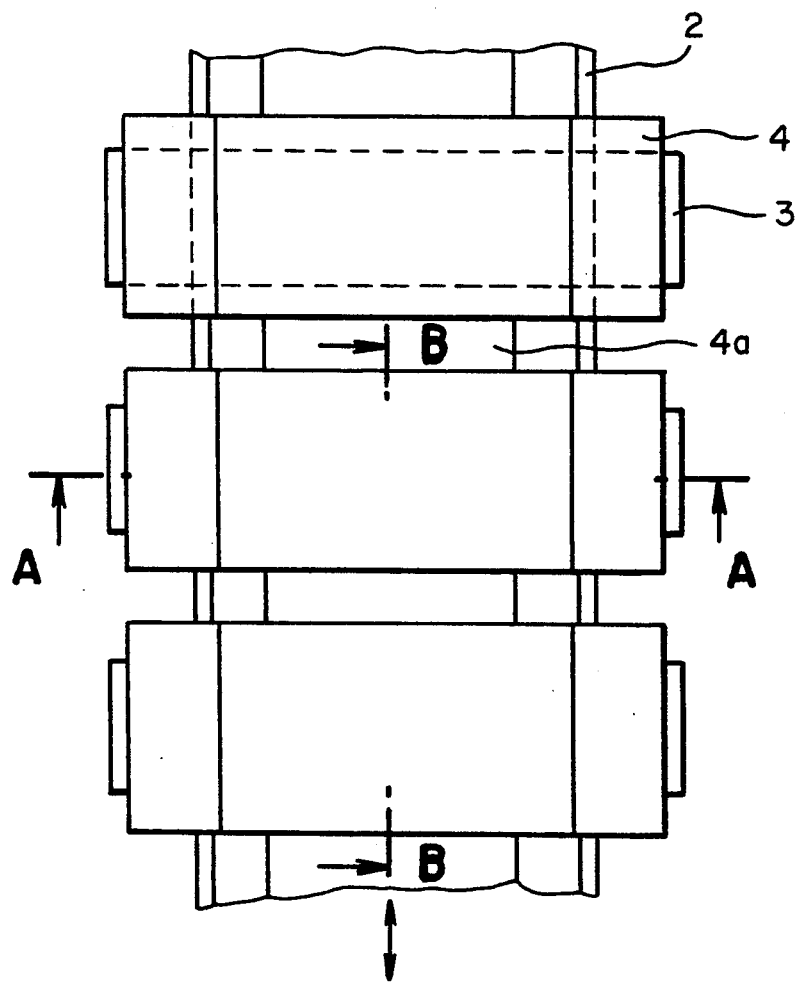
Figure 1C:
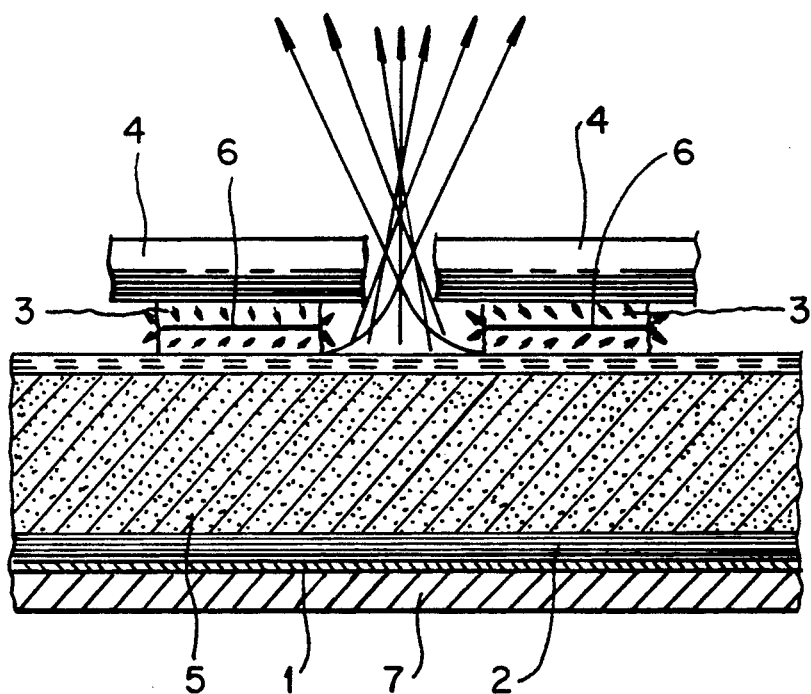
Figure 2:
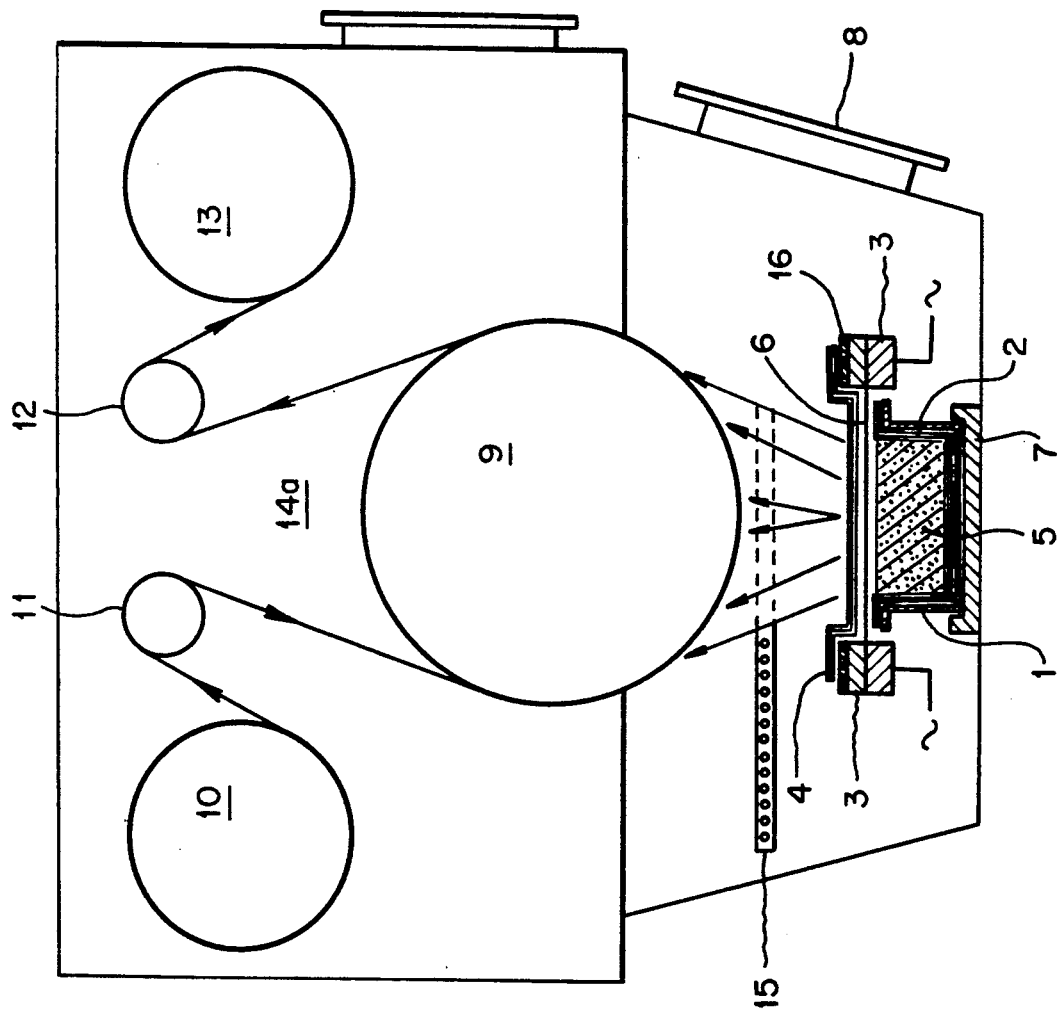
Figure 3A:
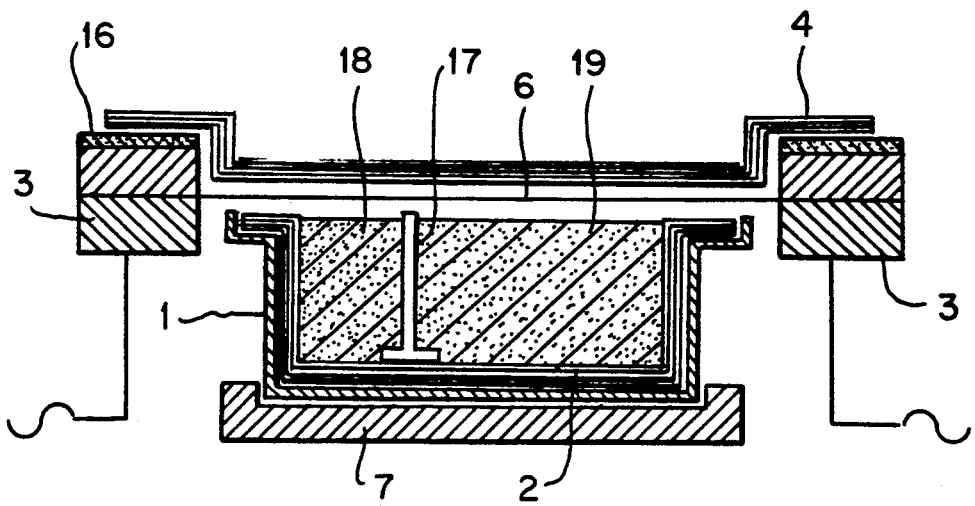

FIG. 1a is a vertical section of a series evaporator along the line A—A in FIG. 1b FIG. 1b is a top view of the series evaporator FIG. 1c is a longitudinal section of the series evaporator along the line B—B in FIG. 1b FIG. 2 is a longitudinal section of a coating unit in diagram form FIGS. 3a,b are a section and a view of a further series evaporator which is divided up by a partition wall FIGS. 1a, 1b, 1c show a series evaporator which has a housing 1 and several shield plates 2. 3 are clamping blocks in which the actual heaters 6 are clamped. Multilayer heat shields 4, between which outlet openings 4a are provided, are located above these clamping blocks 3 and the heaters 6. These outlet openings 4a are 7 to 10 mm wide and thus correspond to about 5% of the area facing the film that is to be coated and to only 1.5% of the total external area of the series evaporator. Eleven of these slit-like outlet openings 4a are provided 148 mm apart to let vapour through. There is no direct visual connection between any of the heaters 6 and the film. Only the material 5 that evaporates at a temperature about 500° C. colder has visual connection to the film and contributes a minimal amount to the heat radiation. Any overheated silicon monoxide particles can only be produced directly below the heater 6. It is not possible for them to reach the film directly. If they hit any of the internal surfaces of the series evaporator, these particles are deflected in such a way that they are still unable to escape through the slit-like outlet openings 4a. Such particles could only in theory escape in the direction of the film after hitting a second surface. This is not the case in practice, as the particles have already lost most of their kinetic energy by then.

The result of these measures is an evaporator which reduces the thermal strain on the films being coated to a large extent while producing the required coating thicknesses of 70 to 120 nanometers, which is able to evaporate silicon monoxide even in loose, free-flowing form and which avoides the harmful ejection of hot particles. By choosing the right geometric conditions—i.e. the distance between the slit-like outlet openings 4a in relation to the distance between these openings and the film—the thickness of the coating at right angles to the direction of web movement only varies by +/−5 per cent. Since each heater 6 has its own energy source, the heating level of each heater can be changed, so that there is a further way to influence the distribution of coating thickness.

On the basis of the series evaporators outlined below, an explanation is given of the evaporation and application to plastic films, paper or metal strip of silicon monoxide and other materials and mixtures of such materials with a similar evaporation pressure level.

The series evaporator shown in FIG. 2 is located about 150 to 300 mm underneath a cooling roller 9. A water-cooled screen 15, which is not opened until a minimum winding speed has been reached, is located between the two. This geometric configuration corresponds in general to classic vacuum coating equipment, with an unwind unit 10, guide rollers 11, 12, a winding unit 13, a winding Chamber 14a and an evaporation chamber 14b. The series evaporator consists of heater clamping blocks 3 positioned 80 to 200 mm apart, between which a heater 6 is in each case located, that can consist of a molybdenum, tantalum or tungsten plate, but can also consist of parallel bars or wire netting made from the same materials. These heaters 6 are each supplied with electricity directly and are each controlled by an infinitely variable electricity supply unit, so that the heater temperatures at right angles to the direction of movement of the web of film being coated and thus the evaporation speed as well can be regulated individually. The heaters 6 are not in contact with the material 5 being evaporated—preferably silicon monoxide—in order to avoid chemical reactions between the heater material and the material 5 being evaporated. The provision of thermal energy to the material 5 being evaporated is by means of radiant heat.

The main features of the invention concern the shielding of the heaters to prevent radiant heat from affecting the film being coated and the elimination of direct visual contact between the heaters 6 and the film, in order to suppress the heat radiation from the heaters and in order to prevent the ejection of particles of evaporation material. These multilayer shields 4 are wider than the heaters 6 so that both these requirements are met.

These multilayer shields 4 are located a few centimeters above the heaters 6. They rest on an insulation plate 16 on the heater clamping blocks 3 and are made from a material with an evaporation pressure that can be disregarded in view of the required heater temperature, so that this material itself does not evaporate. Suitable materials are 2- to 10-layer, thin molybdenum, tantalum or tungsten plates. According to the laws of heat transfer (Gröber/Erk/Grigull: "Wärmeübertragung", pages 390–392), parallel intermediate layers incorporated between a hot, flat object (in this case the heater 6) and a cold panel (in this case the film being coated) reduce heat radiation in accordance with the formula $$Q = Q_o/(n+1)$$

where
$Q_o$ = radiation without shielding (W/m$^2$)
$Q$ = radiation with n intermediate layers (W/m$^2$)
n = number of intermediate layers For practical reasons the number of intermediate layers is limited to about ten. The multilayer shields 4 also have to be designed in such a way that the outlet openings 4a for the vapour are kept as small as possible, so that as little heat radiation as possible can escape through these openings themselves.

Typical heater temperatures for a sufficiently high evaporation speed are about 1750° C. in the case of silicon monoxide, while the surface temperature of the material 5 being evaporated reaches about 1250° C.

When evaporating silicon monoxide, attention also has to be drawn to the fact that thermal decomposition occurs when the material is over-heated to more than 1300° C. If the outlet openings are too small, the heat strain on the film due to radiant heat is kept to the desirably low level. The material 5 being evaporated does, however, have to be heated considerably more, in order to produce the higher evaporation pressure necessary to provide the required evaporation volume of about 3 kg per hour and per meter of working width. If the outlet openings are too large, the heat radiated by the material 5 being evaporated puts excessively high thermal strain on the film.

The optimised levels calculated in advance using computer programs have proved in practice to be highly accurate:

EXAMPLE 12-unit series evaporator for a working width of 1600 mm
Heaters: 12×220 mm ×70 mm, molybdenum plate
Temperature of the evaporation material: 1250° C.
Temperature of the heaters: 1700° C.
Evaporation speed for silicon monoxide: 12×6 g/min.

The following results were determined for the same evaporation speed from the difference in temperature between the cooling water entering and leaving the self-contained screen 15 (FIG. 2):

|  | Radiation (kW) | Condensation heat (kW) |
|---|---|---|
| 1) Heater 6 without shield 4 (unobstructed radiant heat) N-layer shield (Molybdenum plate, emission factor 0,3) Area of the outlet openings/ area of the shield (= f) | 138 | 15.0 |
| 2) n = 4, f = 0.1 | 25.9 | 15.0 |
| 3) n = 6, f = 0.1 | 17.3 | 15.0 |
| 4) n = 6, f = 0 (theoretical shield without openings) | 6.2 | |
| 5) n = 6, f = 0.05 | 14.6 | 15.0 |

Temperature measured on the sixth layer of the shield at an evaporation temperature of 1250° C. and a heater temperature of 1700° C.: 666° C.

Further reduction in the size of the outlet openings has unfavourable effects. The openings then hamper the vapour flow. The only way to compensate for this is to increase the evaporation temperature, which in turn cancels out the improvement that could be achieved with smaller openings.

It is apparent that the heat strain is 80% lower than an unshielded evaporator when cases 1) and 5) are compared. This means that by comparison with processes disclosed in the past layers five times as thick can be applied with the same thermal strain on the film. A further advantage is that it has become possible as a result to vacuum coat with a sufficiently effective gas barrier even film materials that can only cope with lower thermal strain than the polyester normally used. Such materials are: polypropylene films, OPA films, polyethylene films and also lacquered papers.

The overall structure of the series evaporator is as follows:

A housing 1 made from heat-resistant steel, which is located on a support 7 and can be moved out horizontally from underneath the heaters 6 between the heater clamping blocks 3 to be loaded or changed when the evaporation equipment is open, without dismantling the heaters 6 and removing the multilayer shields 4. This housing itself has multilayer shield plates 2 to provide thermal insulation for its outside surfaces. The requirements on these shield plates 2—the purpose of which is to prevent heat radiation—are the same as on the multilayer shields 4. They have to fulfil the additional demand that they do not react chemically with the material 5 being evaporated, which is in contact with the bottom and the sides of the housing. Suitable materials for these plates are molybdenum, tantalum or tungsten. Due to the thermal insulation is has on all sides, which is only interrupted by the outlet openings for the vapour, the series evaporator consumes about 70% less energy than a classic evaporator.

A further advantage is that the flaking problem that can arise when silicon monoxide is evaporated does not occur with this configuration. The explanation for this flaking problem is that overheating can cause such high evaporation pressure under the surface of this brittle material that individual particles about 0.01 to 0.1 mm in size flake off and are ejected from the evaporator. The geometry of the outlet openings 4a and the heaters 6 makes such ejection of particles impossible.

The invention does not relate solely to the evaporation of silicon monoxide or mixtures of silicon and silicon dioxide. In view of the good shielding of the series evaporator and its effective protection against particle ejection, layers of evaporated titanium monoxide, magnesium oxide and silicates that can be evaporated without decomposition can be produced successfully at somewhat lower evaporation speeds but without overheating the films being coated. The materials listed above as well as most metals except chromium evaporate from a liquid phase. to evaporate these substances, a joint vessel or several vessels made from a suitable material, e.g. tantalum, tungsten, zirconium oxide, aluminium oxide, boron nitride or —if the mandatory precautions are taken—beryllium oxide, are used for this purpose in the series evaporators described here.

If the insulation of the multilayer shields 4 and the shield plates 2 in the housing is increased to 10 shield layers, heater temperatures of up to 2400° C. are possible. In the case of 10-layer insulation with tungsten and molybdenum plates, the temperature of the outer layer is 1195° C. The heat radiated amounts to about 47 kW/m$^2$ or typically 16.5 kW for a series evaporator 1600 mm wide. Copper, gold, silver, nickel, chromium, zinc and aluminium can be evaporated.

Figure 3B:
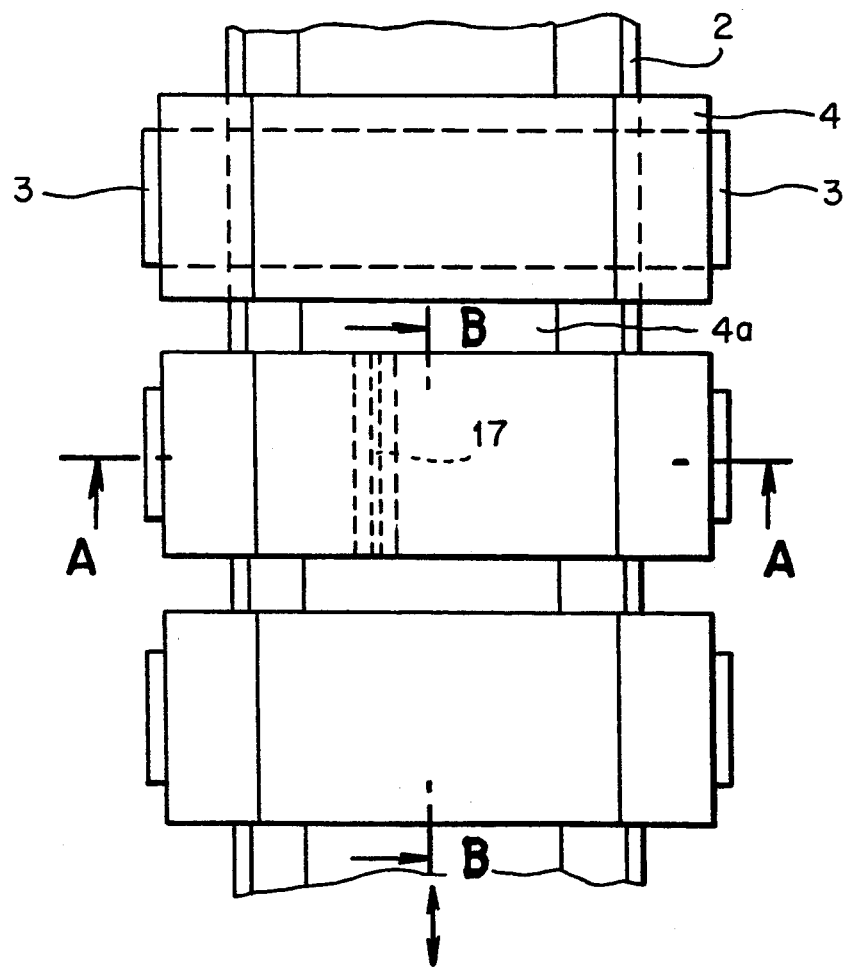

FIG. 3 shows a further embodiment of the series evaporator.

If a partition wall 17 made from a heat-resistant material that can also be a ceramic material, such as aluminium oxide, magnesium oxide, boron nitride or titanium boride, is incorporated, the series evaporator can be used for the simultaneous evaporation of two materials, the individual components only mixing in the vapour phase. This is only possible if the evaporation pressure levels of the two components do not differ by more than a factor of 2 to 3. By varying the division of the space in the vessel into a compartment 18 and a compartment 19 it is possible to influence the amount of component A and component B evaporated per time unit. Since the space inside the vessel has very effective external thermal insulation, except for the outlet openings 4a that only account for a few per cent of the total surface of the inside of the vessel, it can be assumed that the temperature in both compartments 18 and 19 is the same. The substances evaporated from compartment 18 and compartment 19 per time unit are approximately as follows in the case of materials with similar emission figures:

$$m1/m2 = (F1 \times p1 \times o1)/(F2 \times p2 \times o2)$$

m: mass (g)
F: surface of a compartment filled with evaporation material
p: evaporation pressure of each component at the joint temperature level concerned Tests have confirmed a reproducibility level of $+/-10\%$ in the composition of the mixed layer produced in this way. Such mixed layers can be:
Silicon monoxide-chromium
Silicon monoxide-aluminium
Copper-aluminium
Nickel-chromium
Nickel-copper
Silver-copper In the case of metals such as copper, nickel and silver that evaporate from the liquid phase, suitable channel-like vessels made from oxide material, boron nitride or tantalum have to be used instead of a partition wall. Since the emission figure of metals at their evaporation temperature is a factor of 2 to 4 lower than the figure for silicon monoxide or other materials that do not conduct electricity, considerably higher heater temperatures are necessary because of the lower heat transfer as a result. Industrially viable evaporation rates can be achieved in this way.

I claim:

1. A device for heating a material to an evaporation temperature so that the material can be coated on a substrate, comprising:
    a series evaporator for containing the material to be coated;
    a plurality of radiant heaters disposed above said evaporator and the material to be evaporated, said heaters each being essentially flat and disposed parallel and adjacent to the upper surface of the material;
    heat shields disposed above said radiant heaters and below a substrate to be coated and having an area sufficient to prevent direct radiant heat contact with the substrate to be coated; and
    a plurality of vapor outlet openings formed between adjacent heat shields of the series evaporator and facing the substrate to be coated, and in vapor communication with the material, wherein each of said radiant heaters are located beneath an upper heat shield and within the area protected by said heat shields.

2. The device according to claim 1, wherein the material evaporates by sublimation in a high vacuum, said material being selected from the group consisting of silicon monoxide, magnesium oxide, mixtures of metals and their oxides, and chromium metal.

3. The device according to claim 2, wherein said evaporator comprises vessels made from compounds having a high melting point selected from the group consisting of boron nitride, titanium boride and sintered mixtures thereof, aluminum oxide, magnesium oxide and beryllium oxide, so that materials disposed in said vessels can be evaporated from their liquid phase.

4. The device according to claim 3, comprising a partition wall fitted into said evaporator holding the material that is to be evaporated, for creating two compartments for the simultaneous evaporation of two sublimating materials with similar vapor pressure levels, said two materials only mixing when they are both in the vapor phase.

5. The device according to claim 3, wherein said evaporator comprises vessels with two channels or pairs of individuals vessels for holding two liquid materials with similar vapor pressure levels for simultaneous evaporation, said materials only mixing in the vapor phase.

6. The device according to claim 1, wherein said radiant heaters are made of metal selected from the group consisting of tungsten, tantalum or molybdenum.

7. The device according to claim 1, wherein said radiant heaters are constructed in the form of plates disposed within the area protected by said heat shields.

8. The device according to claim 1, wherein said radiant heaters are constructed in the form of wire netting disposed within the area protected by said heat shields.

9. The device according to claim 1, wherein said radiant heaters are constructed in the form of parallel bars disposed within the area protected by said heat shields.

10. The device according to claim 1, wherein said radiant heaters are constructed in the form of wires disposed within the area protected by said heat shields.

11. The device according to claim 1, wherein said series evaporator additionally comprises thermal insulation disposed on all sides thereof and the upper shield plates, said insulation being several individual plates made from a metal selected from the group consisting of molybdenum, tungsten and tantalum.

12. The device according to claim 11, wherein the individual plates of said thermal insulation disposed on all sides of said series evaporator and the upper shield plates is less than one millimeter thick.

13. The device according to claim 1, wherein said series evaporator additionally comprises thermal insulation disposed on all sides of said evaporator housing and the upper shield plates, said insulation being constructed from a material selected from the group consisting of graphite, aluminum oxide, zirconium oxide, and sintered boron nitride/titanium boride mixtures.

14. The device according to claim 13, wherein said thermal insulation disposed on all sides of said series evaporator and the upper shield plates have a thickness of 1 to 4 millimeter per layer.

* * * * *